US012727477B2

(12) United States Patent
Hsieh et al.

(10) Patent No.: US 12,727,477 B2
(45) Date of Patent: Sep. 1, 2026

(54) PACKAGE STRUCTURE AND METHOD FOR FABRICATING THE SAME

(71) Applicant: WISTRON NEWEB CORPORATION, Hsinchu (TW)

(72) Inventors: Kuo-Hua Hsieh, Hsinchu (TW); Chao-Chieh Chan, Hsinchu (TW); Ming-Jhe Wu, Hsinchu (TW); Chih-Yang Weng, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 606 days.

(21) Appl. No.: 18/315,537

(22) Filed: May 11, 2023

(65) Prior Publication Data

US 2024/0055385 A1 Feb. 15, 2024

(30) Foreign Application Priority Data

Aug. 9, 2022 (TW) ................................ 111129800

(51) Int. Cl.

*H10W 72/00* (2026.01)
*H10W 40/25* (2026.01)

(Continued)

(52) U.S. Cl.

CPC .... *H10W 40/251* (2026.01); *H10W 72/01223* (2026.01); *H10W 72/01323* (2026.01); *H10W 72/072* (2026.01); *H10W 72/07202* (2026.01); *H10W 72/07236* (2026.01); *H10W 72/07237* (2026.01); *H10W 72/07253* (2026.01); *H10W 72/073* (2026.01); *H10W 72/07302* (2026.01); *H10W 72/07338* (2026.01); *H10W 72/237* (2026.01); *H10W 72/241* (2026.01); *H10W 72/242* (2026.01); *H10W 72/248* (2026.01);

(Continued)

(58) Field of Classification Search

CPC ......... H01L 24/17; H01L 24/10; H01L 24/11; H01L 21/563

See application file for complete search history.

(56) References Cited

U.S. PATENT DOCUMENTS 5,629,566 A * 5/1997 Doi ........................ H01L 24/81 257/772
6,049,124 A * 4/2000 Raiser .................. H01L 21/563 257/E29.022

(Continued)

*Primary Examiner* — Bradley Smith

(74) *Attorney, Agent, or Firm* — McClure, Qualey & Rodack, LLP

(57) ABSTRACT

A package structure and a method for fabricating the same are provided. The package structure includes a substrate, a semiconductor package and an adhesive body. The substrate has a first board surface and a second board surface. The semiconductor package has an upper surface and a lower surface, is disposed on the first board surface and electrically connected to the substrate through pins, and has a first vertical projection on the first board surface. An adhesive groove is disposed on the first board surface and is located in at least one portion of the first vertical projection and a periphery of the first vertical projection. The adhesive body is disposed in the adhesive groove, and protrudes to contact the lower surface, so as to fix the semiconductor package. The adhesive groove does not overlap with the pins, and the adhesive body does not contact the pins.

17 Claims, 11 Drawing Sheets

(51) Int. Cl.
*H10W 72/20* (2026.01)
*H10W 72/30* (2026.01)
*H10W 90/00* (2026.01)
*H10W 99/00* (2026.01)

(52) U.S. Cl.
CPC ........ *H10W 72/253* (2026.01); *H10W 72/263* (2026.01); *H10W 72/265* (2026.01); *H10W 72/267* (2026.01); *H10W 72/287* (2026.01); *H10W 72/332* (2026.01); *H10W 72/337* (2026.01); *H10W 72/342* (2026.01); *H10W 72/348* (2026.01); *H10W 72/354* (2026.01); *H10W 72/387* (2026.01); *H10W 72/856* (2026.01); *H10W 90/724* (2026.01); *H10W 90/734* (2026.01); *H10W 99/00* (2026.01)

(56) References Cited

U.S. PATENT DOCUMENTS

2010/0025847 A1* 2/2010 Tomura .................. H01L 24/83
257/737
2012/0048607 A1* 3/2012 Takahashi ............. H01L 21/563
174/260
2014/0027920 A1* 1/2014 Kodama ................. H01L 23/28
257/773

* cited by examiner

PACKAGE STRUCTURE AND METHOD FOR FABRICATING THE SAME

CROSS-REFERENCE TO RELATED PATENT APPLICATION

This application claims the benefit of priority to Taiwan Patent Application No. 111129800, filed on Aug. 9, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure and a method for fabricating the same, and more particularly to a package structure and a method for fabricating the same that can accurately control dispensing conditions and an amount of adhesive expansion.

BACKGROUND OF THE DISCLOSURE

For conventional semiconductor devices or systems in packages (SiP), underfill, side-fill or corner/edge bond polymer reinforcement technology is normally utilized in the packaging process to ensure reliability of solder joint of solder ball contacts.

In addition, products after shipment should be able to pass additional reflow processes and qualification tests including variant reliability tests and failure mechanism based tests (for example, the IPC/JEDEC J-STD-020, AEC-Q104 . . . qualifications) to meet customer needs and industrial standards. Furthermore, a to-be-packaged component must be completely clean and dry before the underfill adhesive dispensing process is performed, and the adhesive should be capable of achieving complete filling during the dispensing process. Therefore, such cleaning (chemical or water cleaning), baking, plasma treatment and pressure curing requirements not only incur additional costs, but also affect reliability of the products in the subsequent reflow processes due to variations in the individual processes.

Although the underfill dispensing that requires complete filling can be replaced by the side-fill or corner/edge bond dispensing, additional dispensing process, processing time, cost and equipment for performing glue material thermal or ultraviolet curing are required.

Therefore, for reliably attaching the adhesive to the package component, selecting appropriate dispensing locations and accurately controlling dispensing positions and adhesive profiles are keys to successfully performing the dispensing process in the packaging process.

SUMMARY OF THE DISCLOSURE

In response to the above-referenced technical inadequacies, the present disclosure provides a package structure and a method for fabricating the same that can accurately control an amount of adhesive expansion and dispensing conditions such as positions, shapes, heights and diameters of colloid bodies.

In one aspect, the present disclosure provides a package structure, which includes a substrate, a semiconductor package and at least one adhesive body. The substrate has a first board surface and a second board surface that are opposite to each other. The semiconductor package has an upper surface and a lower surface, the semiconductor package is disposed on the first board surface, and is electrically connected to the substrate through a plurality of pins disposed on the lower surface, the semiconductor package has a first vertical projection projected onto the first board surface, and at least one adhesive groove is disposed on the first board surface and is located in at least one portion of the first vertical projection and a periphery of the first vertical projection. The at least one adhesive body is disposed in the at least one adhesive groove, and protrudes upward from the at least one adhesive groove to contact the lower surface of the semiconductor package, so as to fix the semiconductor package on the first board surface. The at least one adhesive groove does not overlap with the plurality of pins, and the at least one adhesive body does not contact the plurality of pins.

In another aspect, the present disclosure provides a method for fabricating a package structure, and the method includes: providing a substrate, in which the substrate has an upper surface and a lower surface, the upper surface has a first region predetermined for disposing a semiconductor package, and at least one adhesive groove is disposed on the first board surface and is located in at least one portion of the first region and a periphery of the first region; disposing at least one adhesive body in the at least one adhesive groove through a dispensing step, in which the at least one adhesive body protrudes upward from the at least one adhesive groove; contacting the at least one adhesive body with a lower surface of the semiconductor package, such that the semiconductor package is fixed on the substrate and arranged in the first region of the first board surface; and electrically connecting a plurality of pins disposed on a lower surface of the semiconductor package to the substrate. The at least one adhesive groove does not overlap with the plurality of pins, and the at least one adhesive body does not contact the plurality of pins.

Therefore, in the package structure and the method for fabricating the same provided by the present disclosure, dummy bonding pad structures and dummy bonding cavity structures can be utilized with specific characteristics of the adhesive body, so as to accurately control the dispensing conditions such as positions, shapes, heights and diameters of adhesive materials by using positions and structures of dummy pad, to reduce a collapse amount of adhesive material during reflow curing, and to reduce an impact on solder paste and solder ball solder joints due to the adhesive expansion. Therefore, the structure to be formed by the dispensing and goals of the processes, such as the goals of package protection, ensuring solder joints/solder ball reliabilities, or heat dissipation, can be effectively achieved.

In addition, in the package structure and the method for fabricating the same provided by the present disclosure, through the dummy bonding pad structure and the dummy bonding cavity structure, it is possible to avoid excessive adhesive expansion at the bottom which can cause the colloid bodies to wrap around or push against the solder balls or solder joints, thereby avoiding defects such as deformations of the solder balls, or short circuits or open circuits of the solder joints. Therefore, the processes such as the module cleaning, baking, plasma treatment and colloid curing required for the conventional underfill dispensing or the side-fill dispensing can be omitted, which greatly reduces the overall production cost.

On the other hand, in the package structure and the method for fabricating the same provided by the present disclosure, it is also possible to achieve a larger adhesive area for heat dissipation by selecting heat-dissipating adhesive materials with specific functions, accurately controlling the required dispensing conditions and utilizing the dummy bonding pads or dummy bonding cavities, or to achieve a higher thermal conductivity by utilizing metal dummy pads, so as to provide better heat dissipation.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
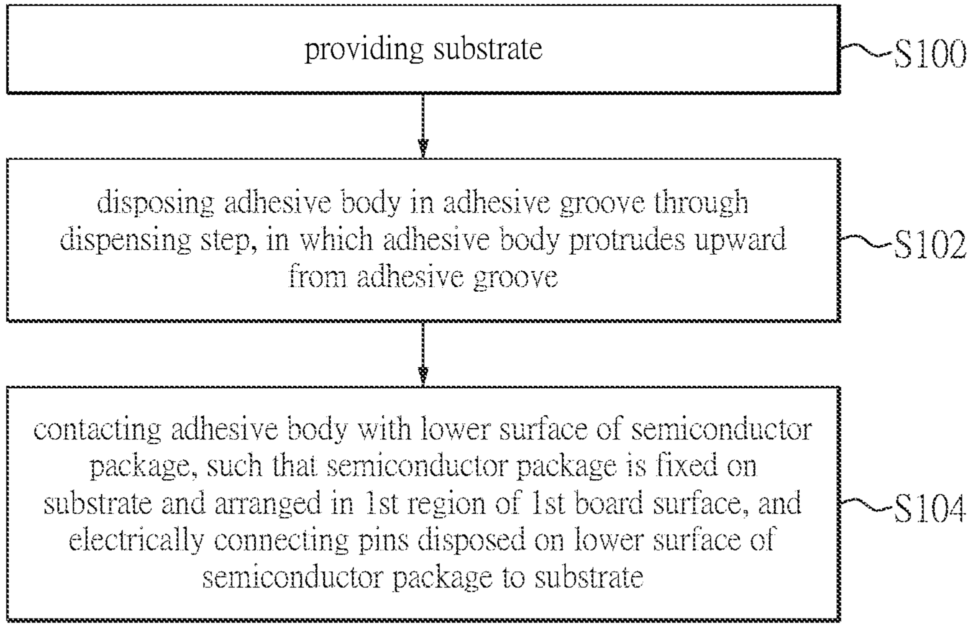
FIG. 1 is a flowchart of a method for fabricating a package structure according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
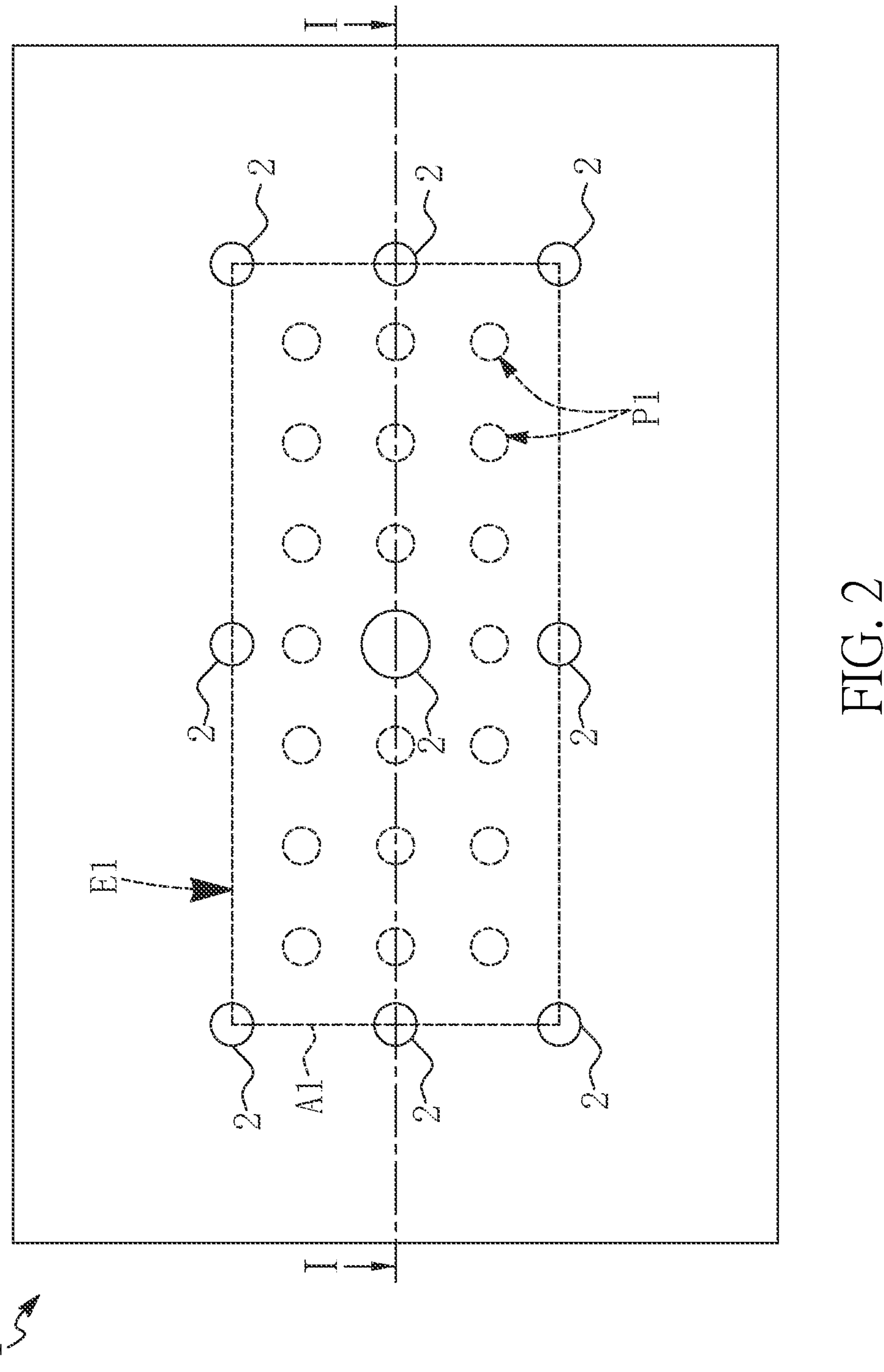
FIG. 2 is a schematic top view of a substrate according to one embodiment of the present disclosure.
Figure 3:
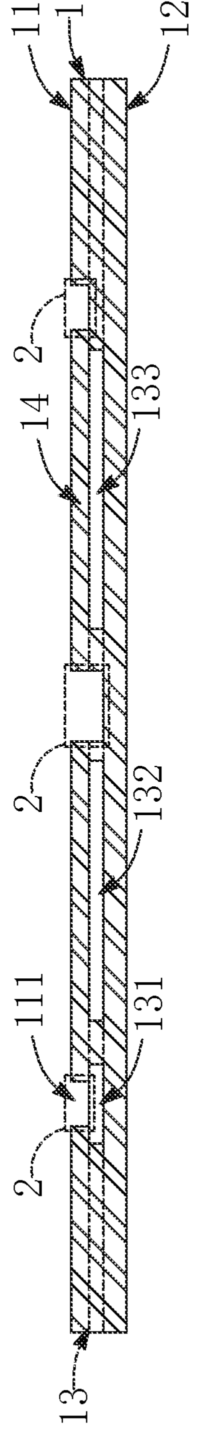
FIG. 3 is a schematic cross-sectional view of the substrate taken along line I-I of FIG. 2.

FIG. 1 is a flowchart of a method for fabricating a package structure according to one embodiment of the present disclosure. Referring to FIG. 1, a first embodiment of the present disclosure provides a method for fabricating a package structure, and the method includes:

Step S100: providing a substrate. FIG. 2 is a schematic top view of a substrate according to one embodiment of the present disclosure, and FIG. 3 is a schematic cross-sectional view of the substrate taken along line I-I of FIG. 2. Referring to FIGS. 2 and 3, the substrate 1 has a first board surface 11 and a second board surface 12 that are opposite to each other, and the first board surface 11 has a first area A1 predetermined for disposing a semiconductor package, and a plurality of adhesive grooves 2 are arranged on the first board surface 11. A part of the adhesive grooves 2 are located in the first region A1, and another part of the adhesive grooves 2 are disposed at a periphery E1 of the first region A1. Here, the manner in which the adhesive grooves 2 are disposed at the periphery E1 can include providing the adhesive grooves 2 on an inner side or an outer side of the periphery E1 without overlapping with the periphery E1, or overlapping with the periphery E1.

It should be noted that the first region A1 is a region for arranging the semiconductor package in subsequent steps, and is exactly a vertical projection of the semiconductor package that is projected onto the first board surface 11 after the semiconductor package is arranged.

In this embodiment, the substrate 1 can be, for example, a printed circuit board, and the substrate 1 can include at least one metal layer 13 and a protective layer 14 covering the at least one metal layer 13. The protective layer 14 can be, for example, a solder mask commonly used on the surface of the printed circuit board, and can be made of glass fiber and epoxy resin, for example, and the protective layer 14 is located at the first board surface 11 and has openings that define the adhesive grooves 2. On the other hand, the metal layer 13 may be made of a conductive metal, such as copper. In addition, as shown in FIG. 2, the first region A1 can be a rectangle, the adhesive grooves 2 are located at a portion of four sides and four corners of the rectangle, and the adhesive grooves 2 that are not located at the periphery E1 of the first region A1 can be located at a center of the rectangle. However, this embodiment is only an example, and the present disclosure does not limit a quantity and positions of the adhesive grooves 2 by a configuration shown in FIG. 2.

Specifically, a layout diagram of solder balls or solder joints of a semiconductor package to be packaged can be obtained first, and after reviewing the layout diagram, a plurality of pin reservation positions P1 for the semiconductor package can be found on the upper surface 11 of the substrate 1, then the remaining regions (e.g., a bottom space, corners or edges of the semiconductor package) serve as multiple locations where dispensing can be performed on, so as to pre-create several solder mask openings on the substrate, and such solder mask openings can be set as dummy solder pads or dummy cavities to serve as dispensing positions. In addition, the solder mask has a predetermined thickness and can be used as a blocking wall in the subsequent steps to limit an expansion space of the adhesive material.

Therefore, as shown in FIG. 3, the metal layer 13 in the substrate 1 is exposed from the openings 111, and the adhesive groove 2 on the left side of FIG. 3 can be defined by a metal member 131 in the metal layer 13 and the opening 111, and metal members 132 and 133 are used to form wires for electrical connections with the semiconductor package. Also, the metal member 131 for defining the glue groove 2 can correspond to a ground portion or a redundant portion of the metal layer 13.

That is, if the metal member 131 is the ground portion, the metal member can be directly electrically connected to a metal member or a metal layer that is electrically grounded, or can be grounded through a through hole disposed under the metal member 131. The present disclosure does not limit the grounding manner used by the metal member 131. If the metal member 131 corresponds to the redundant portion, the metal member 131 can be arranged in the substrate 1 in a floating manner without being electrically connected with any main wire structure. Although the redundant portion is not used to establish the wire structure, it can be used to maintain a metal area ratio of the metal layer 13 to avoid stress warping.

In addition, the thickness of the protective layer 14 can be within a range from 15 μm to 40 μm, and a depth of the adhesive groove can be at least 15 μm.

Step S102: disposing at least one adhesive body in the at least one adhesive groove through a dispensing step, in which the at least one adhesive body protrudes upward from the at least one adhesive groove.

In this step, the dispensing step can be performed by a dispensing machine, and a profile of the adhesive body that is formed can be determined by controlling a viscosity and a temperature of a dispensing fluid, a height and a pressure of the dispensing fluid in a needle cylinder, an inner diameter and length of a needle tip, and a dispensing amount and a shape of the adhesive body.

Figure 4:
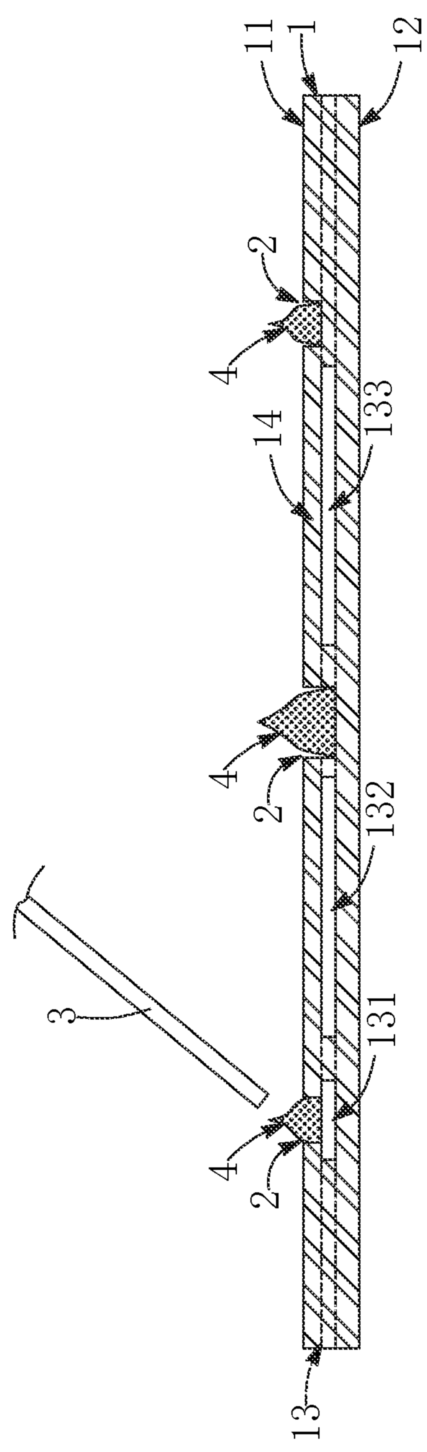
FIG. 4 is a schematic cross-sectional view of step S102 according to one embodiment of the present disclosure.

Reference is made to FIG. 4, which is a schematic cross-sectional view of step S102 according to one embodiment of the present disclosure. As shown in FIG. 4, an adhesive body 4 can be disposed, through a needle cylinder 3, on the first board surface 11 that has already been provided with the plurality of adhesive grooves 2. In addition, an amount of the adhesive to be filled in the adhesive grooves 2 can be controlled based on heights of the pins and a height of the package structure to be formed. In a part of the adhesive grooves 2 that are defined only by the protective layer 13, the adhesive body 4 can only contact a bottom of the adhesive groove 2, or can simultaneously contact the bottom and side walls of the adhesive groove 2 and protrude upward. Similarly, in another part of the adhesive groove 2 that are defined by the protective layer 13 and the metal layer 13, the adhesive body 4 can simultaneously contact the metal layer 13 and the protective layer 13, and protrude upward. Moreover, a height of an upward protrusion of the adhesive body 4 needs to be at least greater than a depth of the adhesive groove 2 and the height of the pins of the semiconductor package, so as to ensure that the adhesive body 4 can contact a bottom of the semiconductor package.

In addition, in one embodiment of the present disclosure, the adhesive body 4 can be, for example, a thermosetting adhesive material with specific properties, which can be referred to in the following table I:

TABLE I

| Adhesive properties | Recommended range |
|---|---|
| Viscosity 25° C. (Pa · s) | ≥50 |
| Thixotropy | 3~6 |
| Glass transition temperature Tg (° C.) | ≤140 |
| Coefficient of thermal expansion (CTE) | ≤170 |
| Modulus 25° C. (Gpa) | ≤6 |
| Curing temperature (° C.) | ≥140 |

Step S104: contacting the at least one adhesive body with a lower surface of the semiconductor package, such that the semiconductor package is fixed on the substrate and arranged in the first region of the first board surface, and electrically connecting a plurality of pins disposed on a lower surface of the semiconductor package to the substrate.

Figure 5A:
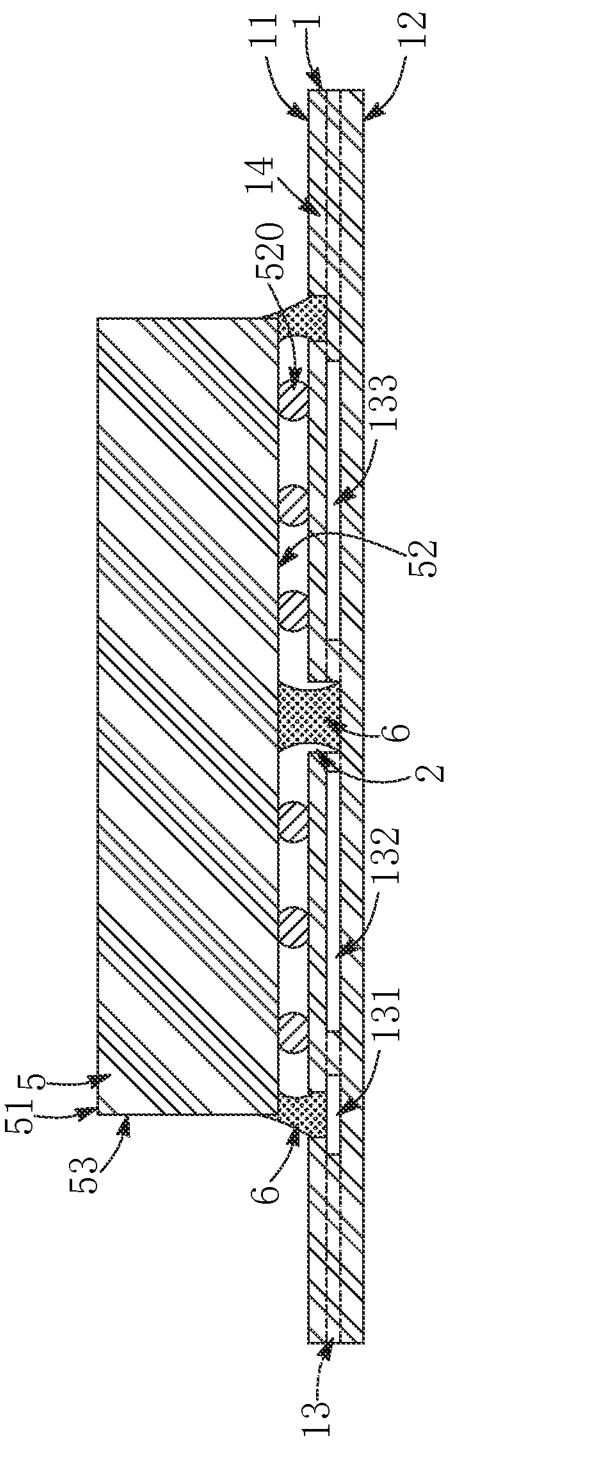
FIGS. 5A and 5B are a first schematic side view and a second schematic side view of step S103 according to one embodiment of the present disclosure.
Figure 5B:
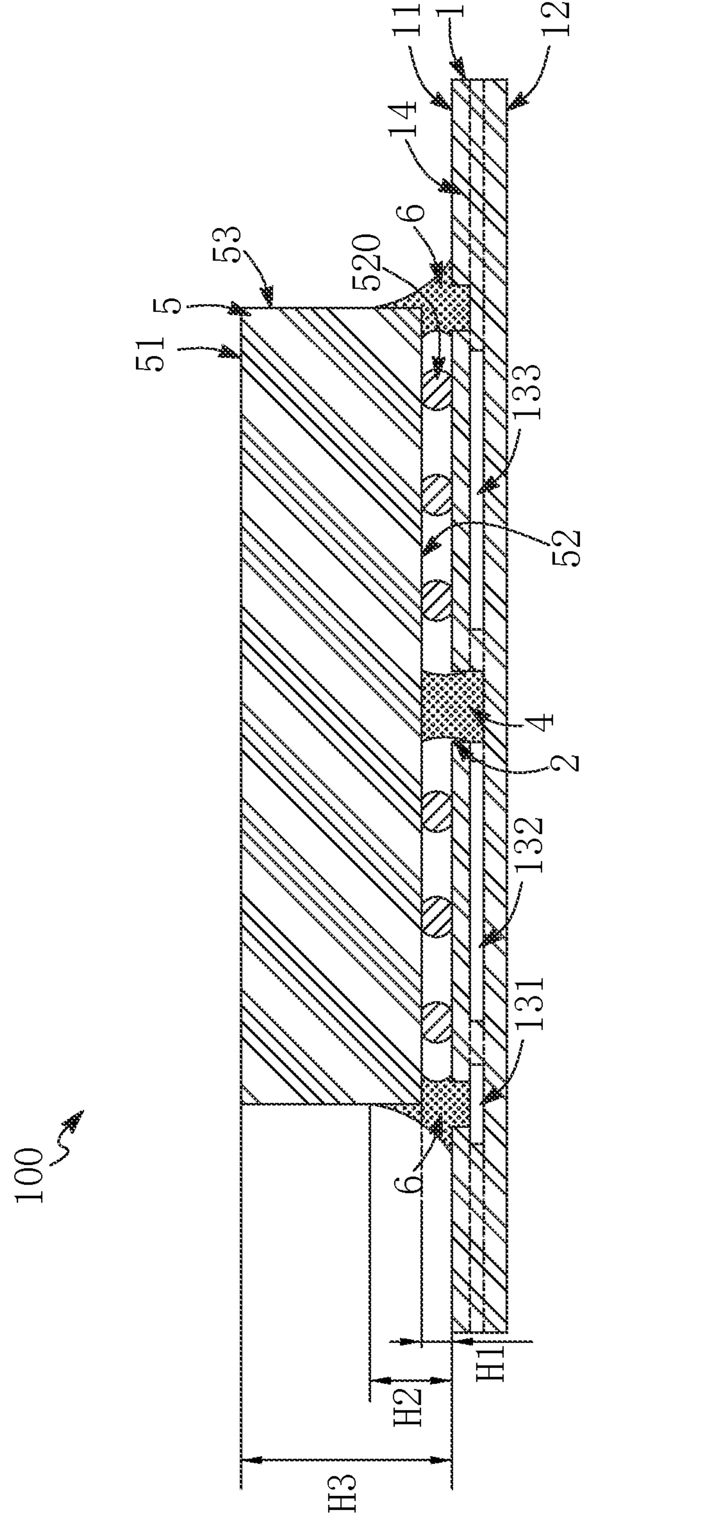

FIGS. 5A and 5B are a first schematic side view and a second schematic side view of step S103 according to one embodiment of the present disclosure. As shown in FIGS. 5A and 5B, the semiconductor package 5 can be an integrated circuit (IC) chip, which is a chip that integrates hundreds to millions or more components. The semiconductor package 5 has an upper surface 51, a lower surface 52 opposite to the upper surface 51, and a side surface 53 between the upper surface 51 and the lower surface 52. A plurality of pins 520 are disposed on the lower surface 52 and can be arranged in a grid-like manner to cover the lower surface 52, such that electronic signals can be conducted from the IC to the printed circuit board (i.e., the substrate 1) where it is located.

Referring to FIGS. 2, 5A and 5B together, the semiconductor package 5 is disposed on the first board surface 11 of the substrate 1, and is located in the first region A1. More precisely, after the semiconductor package 5 is disposed, a vertical projection region projected by the semiconductor package 5 onto the first board surface 11 is the first region A1. It should be noted that in this step, all the adhesive grooves 2 are not overlapped with the plurality of pins 520, and all the colloid bodies 4 does not contact the plurality of pins 520. In addition, in this step, solder paste can be printed on the pin reservation positions P1 where the pins 520 are to be set, and then the semiconductor package 5 with the pins 520 fixed or in contact with the solder paste is placed in the first region A1.

On the other hand, for the adhesive grooves 2 located at the periphery E1 of the first region A1 (that is, the vertical projection of the semiconductor package 5 projected onto the substrate 1), when the semiconductor package 5 is placed on the substrate 1 and in contact with the colloid bodies 4, the colloid bodies 4 form pier colloid bodies 6 to simultaneously contact the lower surface 52 and the side surface 53 of the semiconductor package 5. After an installation of the semiconductor package 5 is completed, a surface mount technique process can be further used. In response to the solder paste being printed on the substrate 1 to be soldered, the solder paste can then be melted at a high temperature, such that the solder paste can wrap the pins 520, and a surface soldering process is completed after the solder paste is cooled and becomes solid. In this process, the used reflow temperature conditions (for example, 170° C. as shown in Table I mentioned above) promote the curing of the adhesive body 4 and fixing the semiconductor package 5 onto the substrate 1, and therefore a position where the semiconductor package 5 is finally adhered, a height, a colloid diameter, an amount of bottom adhesive expansion can be controlled to achieve a space and dispensing conditions of corner or edges that are required by a target package structure product.

In more detail, FIG. 5A shows a state when the semiconductor package 5 is placed on the substrate 1 and contacts the adhesive body 4, and after the SMT process is performed with reflow temperature conditions, since the adhesive body 4 and the pier adhesive body 6 are formed in the adhesive grooves 2, the protective layer 14 (that is, the solder mask) can be used as a blocking wall to block and delay the expansion of the adhesive body 4 and the pier colloid 6 to the outside of the adhesive groove 2, thereby slowing down the adhesive expansion due to a change in viscosity of the adhesive material and melting, collapsing and sinking of the solder paste that are caused by the temperature increases in the reflow processes, as shown in FIG. 5B.

Furthermore, as shown in FIG. 5B, after a package structure 100 is formed, a height H2 of the pier adhesive body 6 can be between a height H1 of the lower surface 52 and a height of the upper surface 51. That is, the first board surface 11 is viewed as the ground, the height of the packaged semiconductor package 5 relative to the first board surface 11 can be referred to as a package height H3, and thus the height H2 of the pier adhesive body 6 is between the height H1 of the lower surface 52 and the package height H3. In a preferred embodiment of the present disclosure, the height H2 of the pier adhesive body 6 ranges between 25% and 100% of the package height H3. In more detail, if the height H2 of the pier colloid 6 is controlled within the above-mentioned range, the pier colloid can be formed with less bottom penetration.

In particular, for a package structure that still requires two or three reflow processes, the adhesive grooves utilized in the embodiments of the present disclosure are used as dummy pads or dummy holes to avoid excessive bottom penetration that causes the colloid bodies wrapping solder balls or solder joints. Profiles of such solder balls or solder joints in the subsequent reflow processes may be affected by certain thermal expansions that cannot be eliminated in time, such as high-temperature molten solder balls, voids in solder joints, or volatilization of flux, which even leads to defects such as solder ball deformation, open circuits and short circuits of the solder joints.

FIGS. 6 to 10 show various implementations of adhesive grooves according to one embodiment of the present disclosure.

Figure 6:
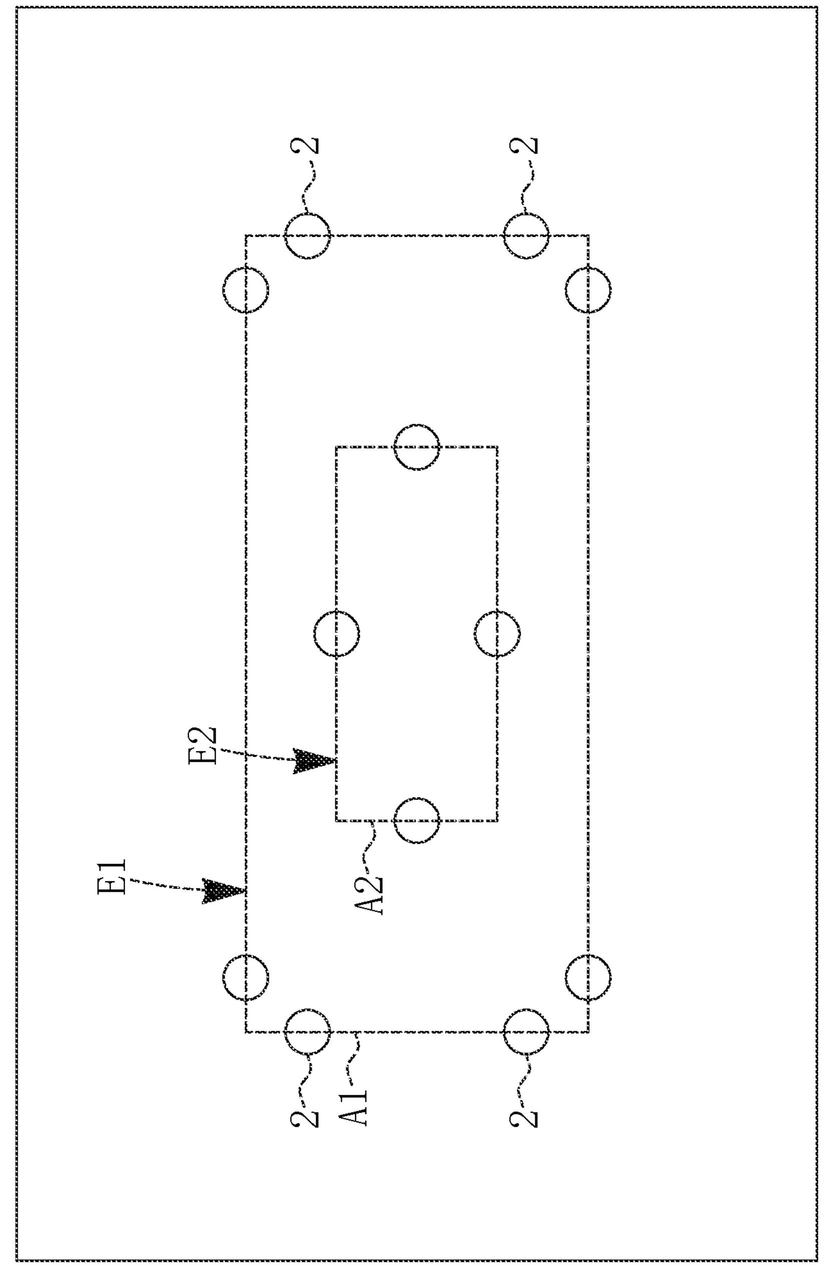
FIGS. 6 to 10 show various implementations of adhesive grooves according to one embodiment of the present disclosure.

As shown in FIG. 6, the adhesive groove 2 located at the periphery E1 of the first region A1 has a vertical projection with a geometrical pattern (for example, a circle in this embodiment) that is projected onto the first board surface 11, and can be dispersedly arranged on a portion of four corners and four sides of the first region A1 (which is a rectangle). In addition, the first region A1 also has a second region A2 located at a center thereof. The second region A2 can also be rectangular, and multiple ones of the adhesive grooves 2 can be disposed on a periphery E2 of the second region A2. It should be noted that the geometrical patterns formed by the adhesive grooves 2 at the periphery E1 and the periphery E2 can be circles, ellipses, L-shapes and lines, and the present disclosure is not limited thereto.

Figure 7:
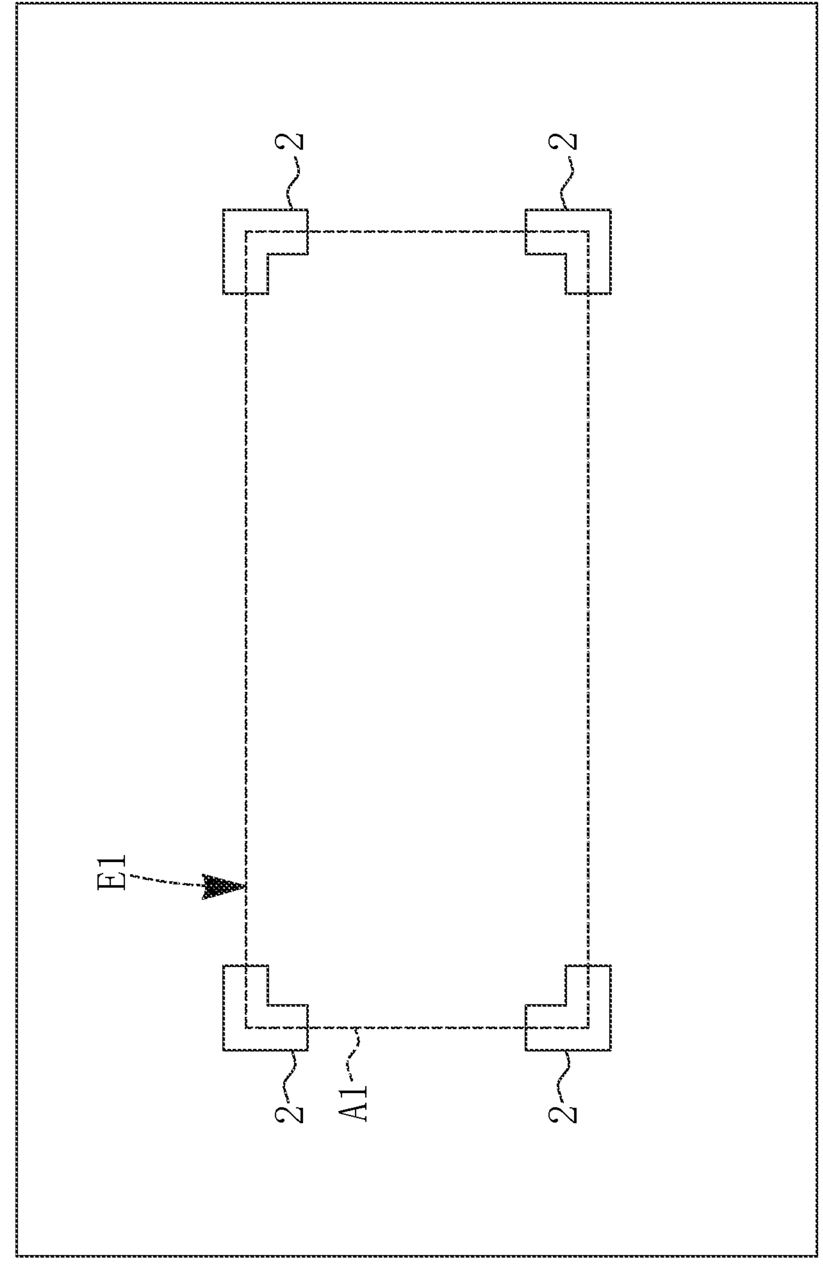

For example, as shown in FIG. 7, the geometrical patterns respectively formed by the adhesive grooves 2 at the periphery E1 are L-shapes, and are arranged at the four corners of the first region A1 (which is a rectangle).

Figure 8:
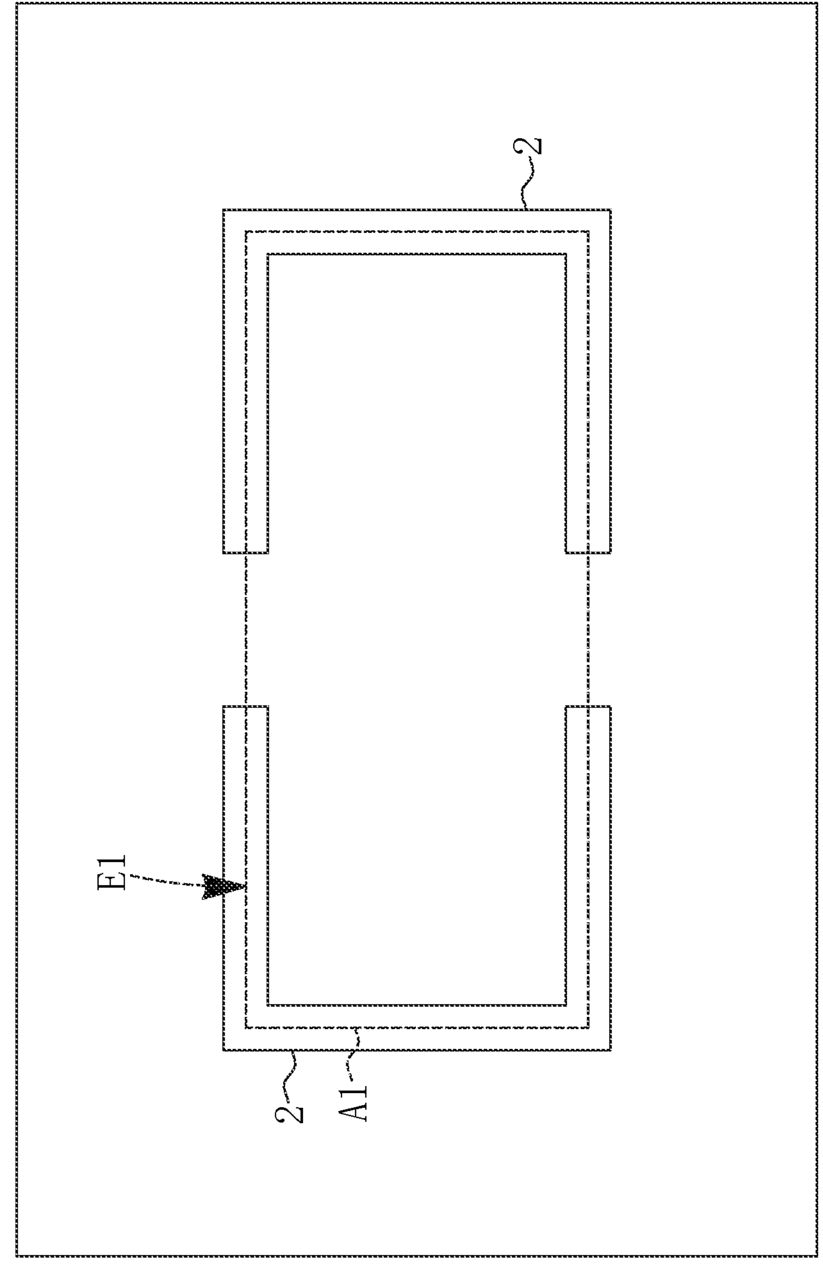

For example, as shown in FIG. 8, the geometrical patterns respectively formed by the adhesive grooves 2 at the periphery E1 are L-shapes, and are arranged at the four corners of the first region A1 (which is a rectangle), and two of the L-shaped adhesives grooves 2 are combined at short sides of the rectangle to form a U-shape.

Figure 9:
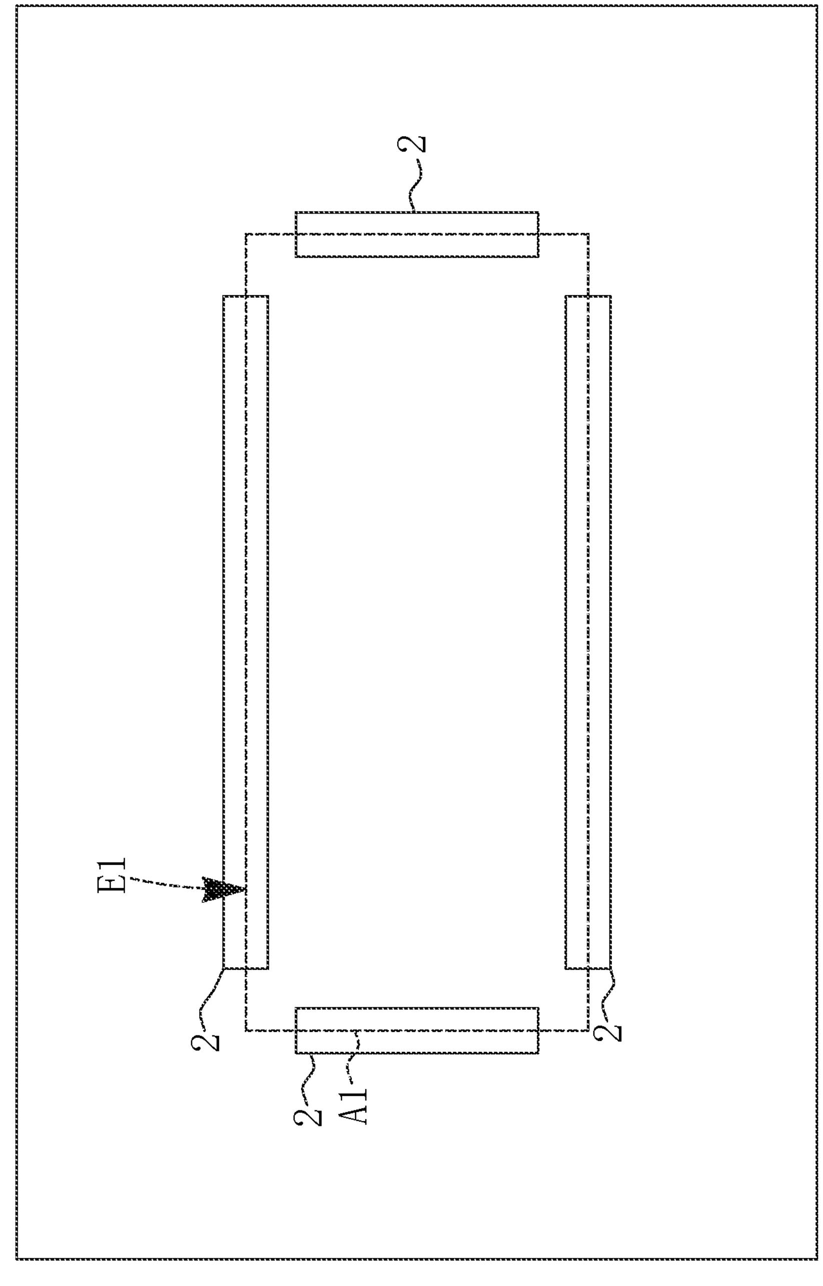

For example, as shown in FIG. 9, the geometrical patterns respectively formed by the adhesive grooves 2 at the periphery E1 are in the shape of lines, and are arranged on each of the four sides of the first region A1 (which is a rectangle).

Figure 10:
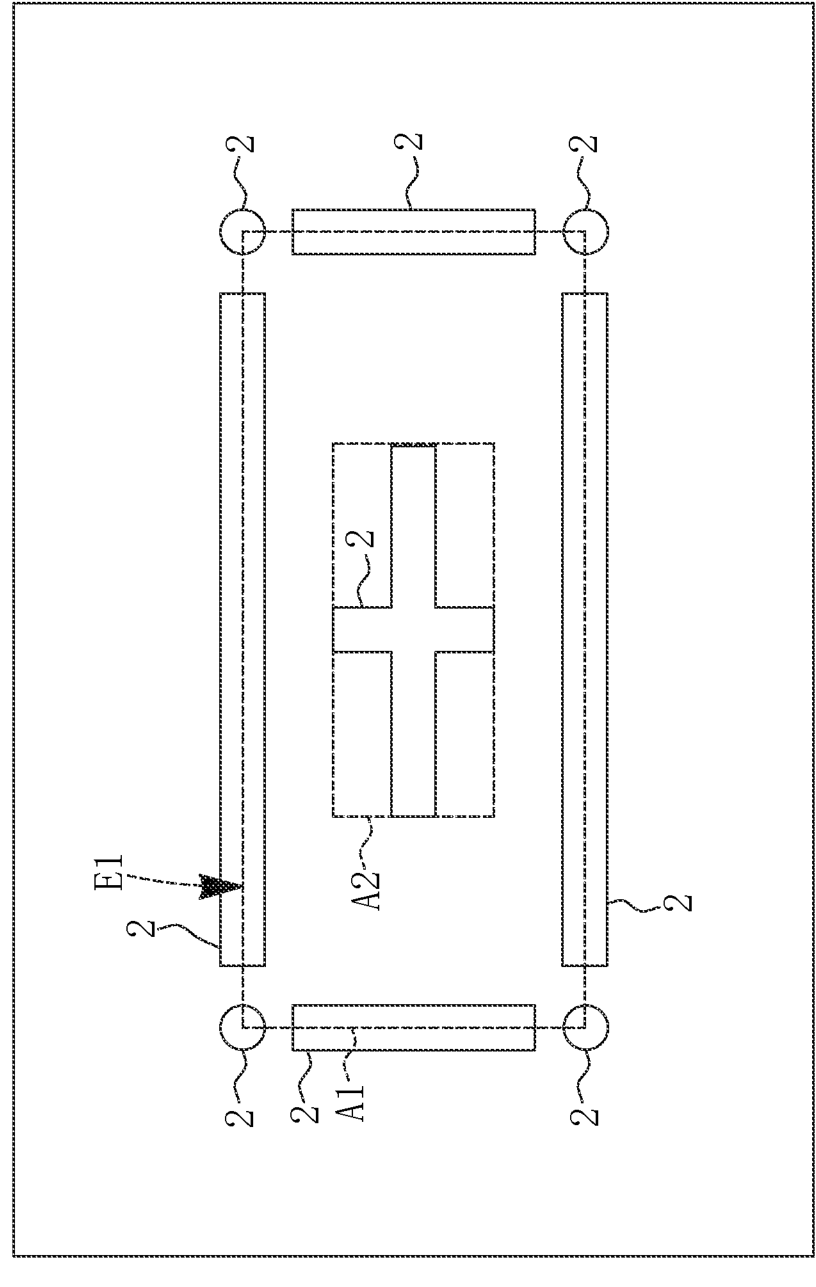

In some embodiments, a part of the adhesive groove 2 that are not located at the periphery E1 can also be projected onto the first board surface 11 to form geometrical patterns. Similarly, the geometrical patterns can be circles, ellipses, L-shapes and lines, and the present disclosure is not limited thereto. For example, as shown in FIG. 10, the geometrical patterns formed by the adhesive grooves 2 at the periphery E1 are each a combination of a line-shape and a circle, and a "+"-shaped adhesive grooves 2 formed by intersecting two line-shaped adhesive grooves 2 is disposed in the second region A2 located at the center of the first region A1. In some embodiments, the second region A2 may also be provided with adhesive grooves 2 with symmetrical patterns, such as "–", "x", and "–"-shaped adhesive grooves 2.

It should be noted that, without affecting structural integrities and design purposes of the adhesive grooves 2, when a quantity of the adhesive grooves 2 is plural, at least one part of the plurality of adhesive grooves 2 can be filled with heat-dissipating adhesive materials. That is to say, a quantity of the colloid bodies 4 can correspond to the quantity of the adhesive grooves 2, and can also be plural, and at least one part or all of the colloid bodies 4 can be made of heat-dissipating adhesive materials. In detail, the heat-dissipating adhesive material is an adhesive with good thermal conductivity, and can also be used to bond the semiconductor package 5 and the adhesive groove 2 in the embodiments of the present disclosure. When the heat-dissipating adhesive material is used, the dummy pads (e.g., the metal member 131) in the adhesive groove can serve as heat sinks to provide a heat-dissipating path.

In some embodiments, the heat-dissipating adhesive material can be formed between the semiconductor package 5 and the adhesive groove 2 in a form of paste or a double-sided tape. Generally, the heat-dissipating adhesive material is a two-component epoxy resin (paste heat-dissipating adhesive) or cyanoacrylate (tape-shaped heat-dissipating adhesive). Specifically, a material with a predetermined thermal conductivity can be selected as the heat-dissipation adhesive material, the thermal conductivity can be in a range of 2 to 8 W/mK, and a thermally conductive adhesive added with metal ions can be used to further improve the thermal conductivity. However, the above are only examples, and the present disclosure is not limited thereto.

[Beneficial Effects of the Embodiments]

In conclusion, in the package structure and the method for fabricating the same provided by the present disclosure, dummy bonding pad structures and dummy bonding cavity structures can be utilized with specific characteristics of the adhesive body, so as to accurately control the dispensing conditions such as positions, shapes, heights and diameters of adhesive materials by using positions and structures of dummy pad or cavity, to reduce an overflow of collapse amount of adhesive material during reflow or thermal curing, and to reduce an impact on solder paste and solder ball solder joints due to the adhesive expansion. Therefore, the structure to be formed by the dispensing and goals of the processes, such as the goals of package protection, ensuring solder joints/solder ball reliabilities, or heat dissipation, can be effectively achieved.

In addition, in the package structure and the method for fabricating the same provided by the present disclosure, through the dummy bonding pad structure and the dummy bonding cavity structure, it is possible to avoid excessive adhesive expansion at the bottom of the chip package or underneath the chip package, which can cause the colloid bodies to wrap around or push against the solder pastes, balls or solder joints, thereby avoiding defects such as deformations of the solder balls, or short circuits or open circuits of the solder joints. Therefore, the processes such as the module cleaning, baking, plasma treatment and colloid curing required for the conventional underfill dispensing or the side-fill dispensing can be omitted, which greatly reduces the overall production cost.

On the other hand, in the package structure and the method for fabricating the same provided by the present disclosure, it is also possible to achieve a larger adhesive area for heat dissipation by selecting heat-dissipating adhesive materials with specific functions, accurately controlling the required dispensing conditions and utilizing the dummy bonding pads or dummy bonding cavities, or to achieve a higher thermal conductivity by utilizing metal dummy pads, so as to provide better heat dissipation.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A package structure, comprising:

a substrate having a first board surface;

a semiconductor package and a plurality of pins, the semiconductor package having an upper surface and a lower surface, the pins being disposed on the lower surface, wherein the pins are sandwiched between the first board surface of the substrate and the lower surface of the semiconductor package, the semiconductor package is electrically connected to the substrate through the plurality of pins, the semiconductor package has a first vertical projection projected onto the first board surface, and at least one adhesive groove is disposed on the first board surface and is located in at least one portion of the first vertical projection and a periphery of the first vertical projection;

at least one adhesive body disposed in the at least one adhesive groove, wherein the at least one adhesive body protrudes upward from the at least one adhesive groove to contact the lower surface of the semiconductor package, so as to fix the semiconductor package on the first board surface;

wherein the at least one adhesive groove does not overlap with the plurality of pins, and the at least one adhesive body does not contact the plurality of pins;

wherein the package structure has no underfill, and the plurality of pins do not contact any colloid.

2. The package structure according to claim 1, wherein the substrate includes at least one metal layer and a protective layer that covers the at least one metal layer, and the protective layer is located at the first board surface and has at least one opening for defining the at least one adhesive groove.

3. The package structure according to claim 2, wherein the at least one metal layer is exposed from the at least one opening, the at least one adhesive groove is defined by the at least one metal layer and the at least one opening, and the at least one adhesive body contacts the at least one metal layer and the protective layer.

4. The package structure according to claim 3, wherein the at least one adhesive groove corresponds to a ground portion or a redundant portion of the at least one metal layer.

5. The package structure according to claim 2, wherein the protective layer has a first thickness, the at least one adhesive groove has a first depth, the first thickness is within a range from 15 μm to 40 μm, and the first depth is at least 15 μm.

6. The package structure of claim 1, wherein the semiconductor package has a side surface between the upper surface and the lower surface, and a portion of the at least one adhesive body that is located in the at least one adhesive groove at the periphery of the first vertical projection forms a pier adhesive body, which contacts both the lower surface and the side surface of the semiconductor package.

7. The package structure according to claim 6, wherein a height of the pier adhesive body ranges between 25% and 100% of a height of the semiconductor package.

8. The package structure according to claim 1, wherein a portion of the at least one adhesive groove located at the periphery of the first vertical projection forms at least one second vertical projection with at least one geometrical pattern onto the first board surface, and the at least one geometrical pattern is selected from a group consisting of a circle, an ellipse, an L-shape and a line.

9. The package structure according to claim 8, wherein a quantity of the at least one adhesive groove is plural, the first vertical projection is a rectangle, and the plurality of adhesive grooves are located at a portion of four corners and four sides of the rectangle.

10. The package structure according to claim 1, wherein a portion of the at least one adhesive groove that is not located at the periphery of the first vertical projection forms at least one second vertical projection onto the first board surface, the at least one second vertical projection has at least one geometrical pattern, and the at least one geometrical pattern is selected from a group consisting of a circle, an ellipse, an L-shape and a line.

11. The packaging structure according to claim 10, wherein a quantity of the at least one adhesive groove is plural, the first vertical projection is a rectangle, and the portion of the at least one adhesive groove that is not located at the periphery of the first vertical projection is located at a center of the rectangle.

12. The package structure according to claim 1, wherein the at least one adhesive body is made of a heat-dissipating adhesive material.

13. A method for fabricating a package structure, the method comprising:

providing a substrate, wherein the substrate has a first board surface, the first board surface has a first region predetermined for disposing a semiconductor package, and at least one adhesive groove is disposed on the first board surface and is located in at least one portion of the first region and a periphery of the first region;

disposing at least one adhesive body in the at least one adhesive groove through a dispensing step, wherein the at least one adhesive body protrudes upward from the at least one adhesive groove;

contacting the at least one adhesive body with a lower surface of the semiconductor package, such that the semiconductor package is fixed on the substrate through a plurality of pins that are disposed on the lower surface of the semiconductor package and that are arranged in the first region of the first board surface; and electrically connecting a plurality of pins disposed on a lower surface of the semiconductor package to the substrate, wherein the at least one adhesive groove does not overlap with the plurality of pins, and the at least one adhesive body does not contact the plurality of pins, and wherein the package structure has no underfill, and the plurality of pins do not contact any colloid.

14. The method according to claim 13, wherein the substrate includes at least one metal layer and a protective layer that covers the at least one metal layer, and the protective layer is located at the first board surface and has at least one opening for defining the at least one adhesive groove.

15. The method according to claim 14, wherein the at least one metal layer is exposed from the at least one opening, the at least one adhesive groove is defined by the at least one metal layer and the at least one opening, and the at least one adhesive body contacts the at least one metal layer and the protective layer.

16. The method according to claim 15, wherein the at least one adhesive groove corresponds to a ground portion or a redundant portion of the at least one metal layer.

17. The method according to claim 14, wherein the protective layer has a first thickness, the at least one adhesive groove has a first depth, the first thickness is within a range from 15 μm to 40 μm, and the first depth is at least 15 μm.

* * * * *